United States Patent
Breinlinger et al.

(10) Patent No.: US 10,359,447 B2
(45) Date of Patent: Jul. 23, 2019

(54) PROBES WITH SPRING MECHANISMS FOR IMPEDING UNWANTED MOVEMENT IN GUIDE HOLES

(71) Applicant: FormFactor, Inc., Livermore, CA (US)

(72) Inventors: Keith J. Breinlinger, Livermore, CA (US); Kevin J. Hughes, Livermore, CA (US)

(73) Assignee: FormFactor, Inc., Livermore, CA (US)

( * ) Notice: Subject to any disclaimer, the term of this patent is extended or adjusted under 35 U.S.C. 154(b) by 328 days.

(21) Appl. No.: 13/665,247

(22) Filed: Oct. 31, 2012

(65) Prior Publication Data

US 2014/0118016 A1    May 1, 2014

(51) Int. Cl.
| | | |
|---|---|---|
| G01R 31/20 | (2006.01) | |
| G01R 1/067 | (2006.01) | |
| G01R 1/073 | (2006.01) | |

(52) U.S. Cl.
CPC ..... *G01R 1/06705* (2013.01); *G01R 1/07357* (2013.01); *G01R 1/06733* (2013.01); *G01R 1/06738* (2013.01); *G01R 1/07314* (2013.01)

(58) Field of Classification Search
CPC .............. G01R 1/06705; G01R 1/0675; G01R 1/07357; G01R 1/07371; G01R 1/06722; H01R 12/714; H01R 13/2421; H01R 12/585; H05K 7/1061
USPC ............ 324/750.25, 755.01, 755.03–755.06, 324/755.11; 439/482, 751
See application file for complete search history.

(56) References Cited

U.S. PATENT DOCUMENTS

| | | | | |
|---|---|---|---|---|
| 4,027,935 A | * | 6/1977 | Byrnes ............... | G01R 1/07357 439/289 |
| 4,655,537 A | * | 4/1987 | Andrews, Jr. ........ | H01R 12/585 439/751 |
| 5,692,420 A | * | 12/1997 | Byers .................... | B25B 13/461 81/463 |
| 5,730,606 A | * | 3/1998 | Sinclair .................. | H01R 13/04 439/70 |
| 6,464,511 B1 | | 10/2002 | Watanabe et al. | |
| 7,114,996 B2 | * | 10/2006 | Goodman et al. ............ | 439/700 |
| 7,690,925 B2 | * | 4/2010 | Goodman ....................... | 439/70 |

(Continued)

FOREIGN PATENT DOCUMENTS

| | | |
|---|---|---|
| JP | 2010-091335 | 4/2010 |
| KR | 20-2000-002078 | 9/2002 |
| KR | 10-0373152 | 2/2003 |

OTHER PUBLICATIONS

The International Search Report and The Written Opinion of the International Searching Authority, PCT Application Serial No. PCT/US2013/067332 (dated Feb. 18, 2014), 19 pages.

(Continued)

*Primary Examiner* — Alesa Allgood
*Assistant Examiner* — Brent J Andrews
(74) *Attorney, Agent, or Firm* — Lumen Patent Firm

(57) ABSTRACT

Elongated flexible probes can be disposed in holes of upper and lower guide plates of a probe card assembly. Each probe can include one or more spring mechanisms that exert normal forces against sidewalls of holes in one of the guide plates. The normal forces can result in frictional forces against the sidewalls that are substantially parallel to the sidewalls. The frictional forces can reduce or impede movement parallel to the sidewalls of the probes in the holes.

21 Claims, 12 Drawing Sheets

(56) References Cited

U.S. PATENT DOCUMENTS

| | | |
|---|---|---|
| 2004/0127071 A1 | 7/2004 | Weiss et al. |
| 2007/0257685 A1 | 11/2007 | Mochizuki |
| 2009/0325406 A1* | 12/2009 | Kojima .................. H01R 12/57 439/82 |
| 2010/0052707 A1 | 3/2010 | Nakayama et al. |
| 2010/0231249 A1* | 9/2010 | Dang et al. .................... 324/758 |
| 2010/0231251 A1* | 9/2010 | Nelson ................. G01R 1/0466 324/755.09 |

OTHER PUBLICATIONS

International Preliminary Report on Patentability, PCT Application Serial No. PCT/US2013/067332 (dated May 5, 2015), 9 pages.

\* cited by examiner

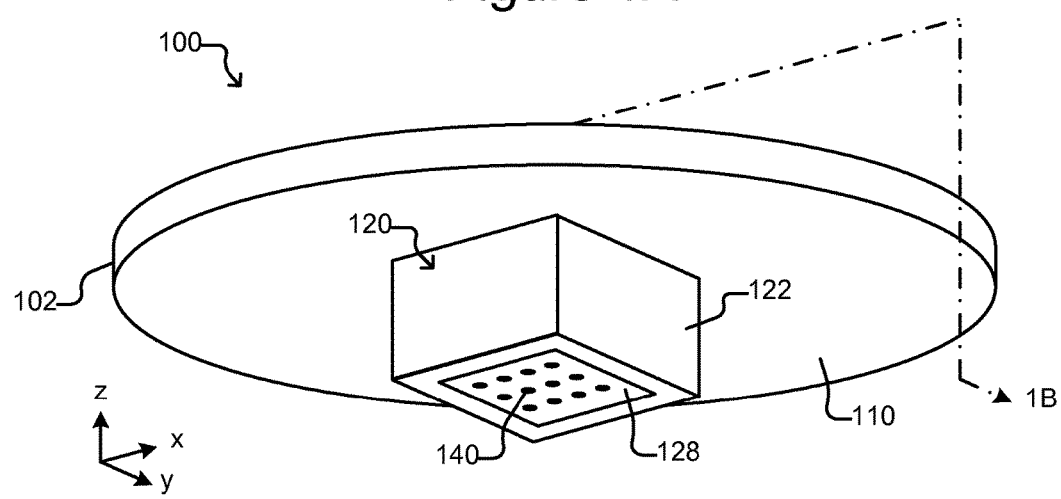

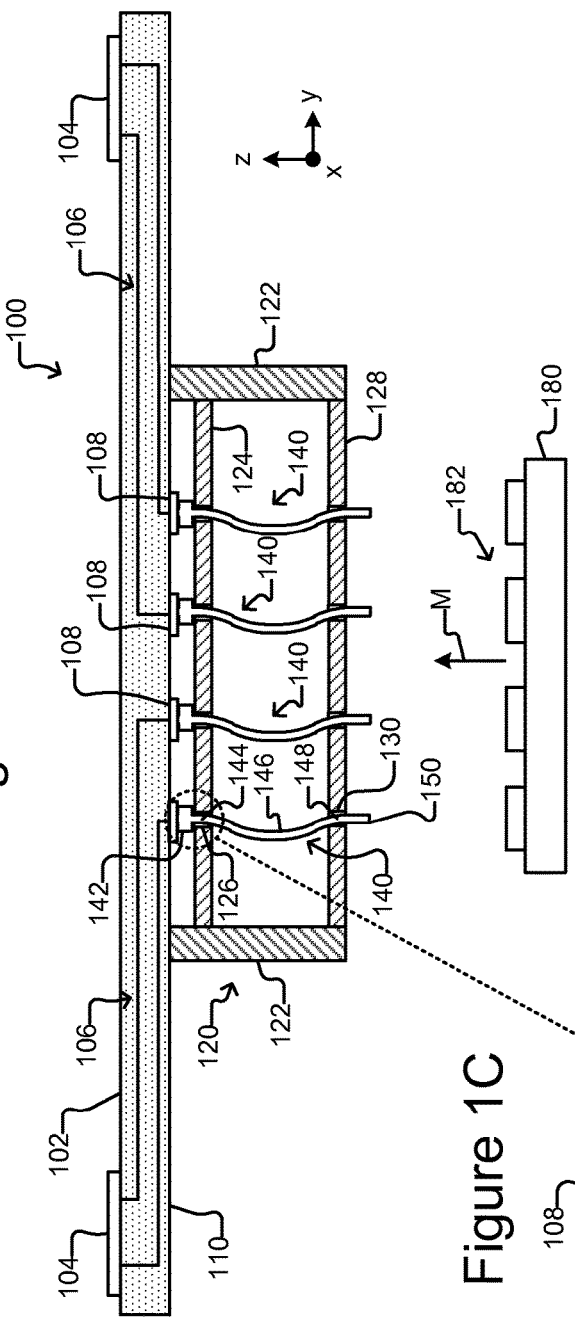
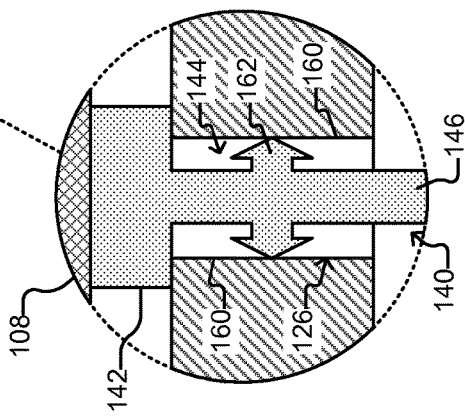

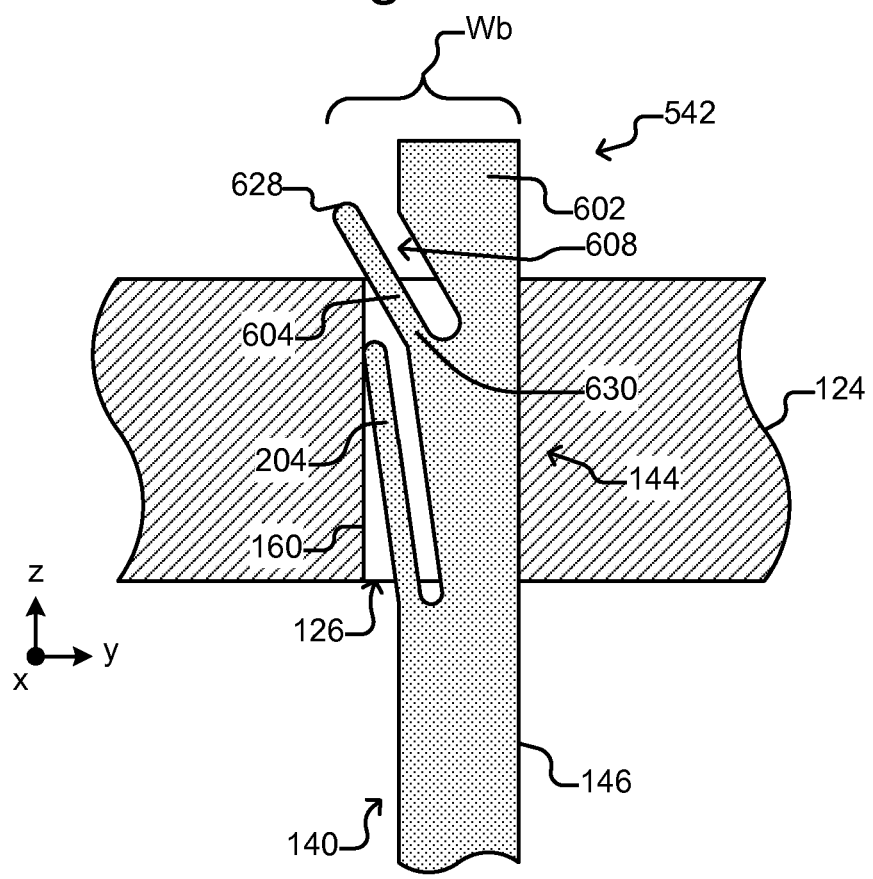

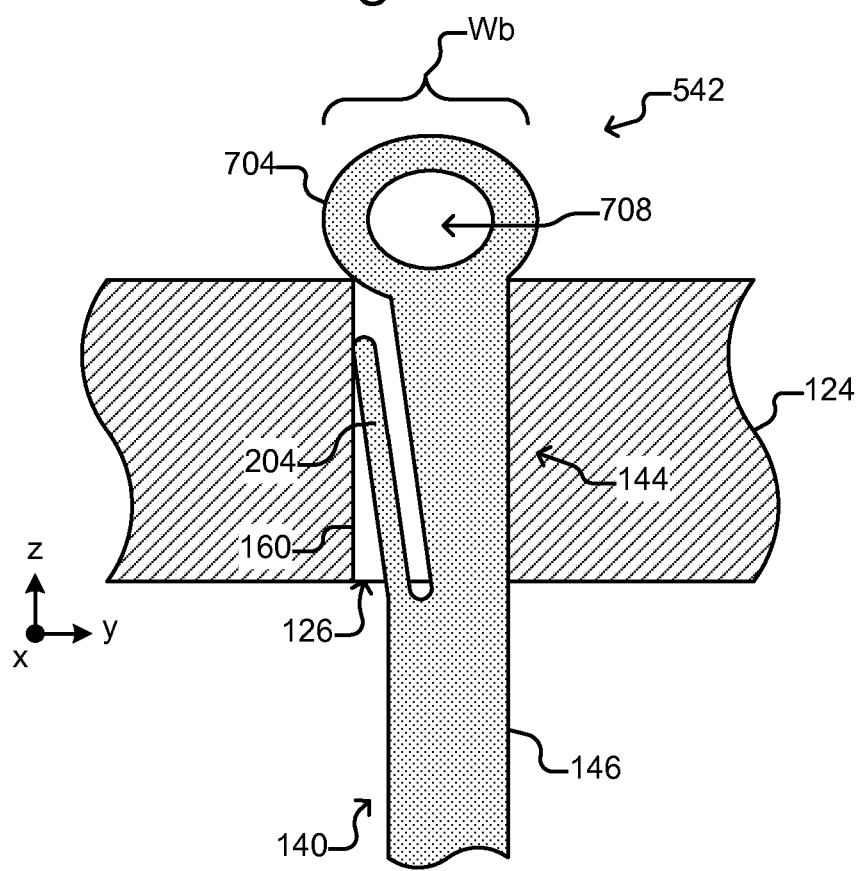

US 10,359,447 B2

PROBES WITH SPRING MECHANISMS FOR IMPEDING UNWANTED MOVEMENT IN GUIDE HOLES

BACKGROUND

Some types of probe card assemblies comprise elongated probes each disposed within holes of spaced apart guide plates. As terminals of an electronic device to be tested are pressed against contact ends of the probes, the probes can slide in the holes in the guide plates and/or bend, which can ensure that opposite ends of the probes are compressed between the terminals of the electronic device being tested and terminals of the probe card assembly. Because the probes can move within the holes in the guide plates, however, the probes can move out of position prior to using the probe card assembly to test an electronic device. Additionally, the movement of probes in the holes can make assembly operations and repair operations of the probe card assembly more difficult. Embodiments of the present invention can inhibit such unwanted movement of the probes and thus avoid problems arising from such unwanted movement.

SUMMARY

In some embodiments, a probe card assembly can include electrically conductive terminals disposed on a substrate, and a probe assembly coupled to the substrate. The probe assembly can include a guide plate and electrically conductive probes. Each probe can include a base end, a contact end, and an elongated flexible body between the base end and the contact end. A portion of the body can be disposed inside one of the guide holes and can include a first spring mechanism configured to exert a normal force against sidewalls of the guide hole. The normal force can be sufficiently large to reduce movement of the probe in the guide hole.

BRIEF DESCRIPTION OF THE DRAWINGS

FIG. 1A is a bottom, perspective view of an example of a probe card assembly according to some embodiments of the invention.

FIG. 1B is a side, cross-sectional view of the probe card assembly of FIG. 1A.

FIG. 1C is a detailed view of an upper body portion of a probe disposed in a guide hole and comprising a spring mechanism for impeding inadvertent movement of the probe in the guide hole according to some embodiments of the invention.

FIG. 6A is a side, cross-sectional partial view of a probe in which the compressible stop structure comprises a cantilevered beam according to some embodiments of the invention.

FIG. 7A is a side, cross-sectional partial view of a probe in which the compressible stop structure comprises a hollow bulb structure according to some embodiments of the invention.

DETAILED DESCRIPTION OF EXEMPLARY EMBODIMENTS

Figure 2A:
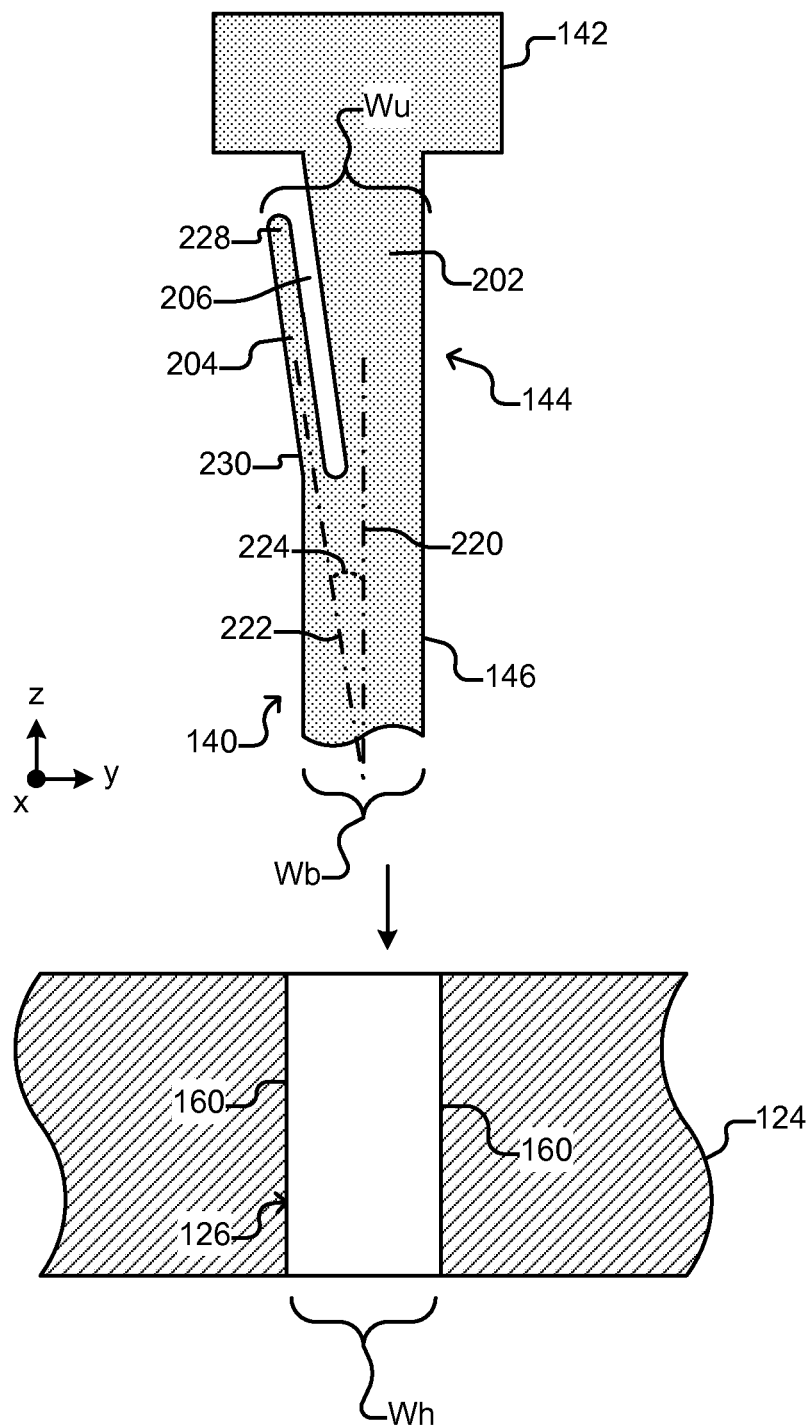
FIG. 2A is a side, cross-sectional partial view of a probe in which the spring mechanism comprises a cantilevered beam according to some embodiments of the invention.

This specification describes exemplary embodiments and applications of the invention. The invention, however, is not limited to these exemplary embodiments and applications or to the manner in which the exemplary embodiments and applications operate or are described herein. Moreover, the Figures may show simplified or partial views, and the dimensions of elements in the Figures may be exaggerated or otherwise not in proportion for clarity. In addition, as the terms "on," "attached to," or "coupled to" are used herein, one object (e.g., a material, a layer, a substrate, etc.) can be "on," "attached to," or "coupled to" another object regardless of whether the one object is directly on, attached, or coupled to the other object or there are one or more intervening objects between the one object and the other object. Also, directions (e.g., above, below, top, bottom, side, up, down, under, over, upper, lower, horizontal, vertical, "x," "y," "z," etc.), if provided, are relative and provided solely by way of example and for ease of illustration and discussion and not by way of limitation. In addition, where reference is made to a list of elements (e.g., elements a, b, c), such reference is intended to include any one of the listed elements by itself, any combination of less than all of the listed elements, and/or a combination of all of the listed elements.

As used herein, "substantially" means sufficient to work for the intended purpose. "Substantially parallel" means within plus or minus five degrees of parallel. "Substantially normal" means within plus or minus five degrees of normal. "Substantially orthogonal" means within plus or minus five degrees of orthogonal. "Substantially perpendicular" means within plus or minus five degrees of perpendicular.

The term "ones" means more than one. "Elongated" means having a length dimension that is greater than any other dimension.

Directions are, at least at times, illustrated in the Figures and referred to herein with regard to orthogonal axes x, y, and z. A z direction refers to a direction that is parallel to the z axis. As illustrated in the Figures, the z axis and thus a z direction can be vertical, and the x, y plane can be horizontal. Alternatively, the x, y, and z axes can be oriented other than with the z axis vertical.

In some embodiments of the invention, elongated flexible probes disposed in corresponding holes of upper and lower guide plates of a probe card assembly can include one or more spring mechanisms that exert normal forces against sidewalls of the holes in one of the guide plates. The normal forces result in frictional forces against the sidewalls that are substantially parallel to the sidewalls, which can reduce or impede movement of the probes in the holes.

FIGS. 1A-1C illustrate an example of a probe card assembly 100 comprising probes 140 each having a spring mechanism 162 for exerting normal (i.e., substantially in a plane that is parallel to the x, y plane) forces against the sidewalls 160 of an upper guide hole 126 in an upper guide plate 124, which thereby provide a frictional force that is substantially parallel to the sidewalls 160 according to some embodiments of the invention. The frictional force can reduce or impede unwanted movement of the probe 140 in the upper guide hole 126 that is parallel to the sidewalls 160.

As shown, the probe card assembly 100 can comprise an electrical interface 104, a wiring substrate 102, and a probe assembly 120. As will be discussed below with regard to FIG. 8, the interface 104 can provide electrical connections to and from a tester for controlling testing of an electronic device 180. The electronic device 180 can be, for example, one or more semiconductor dies (singulated or unsingulated from the semiconductor wafer from which the dies were fabricated) and/or other types of electronic devices. The interface 104 can comprise any electrical connector that provides multiple electrical connections. The interface 104 can be, for example, one or more zero-insertion-force electrical connectors, pogo pin pads, or the like.

As shown, the interface 104 can be disposed on the wiring substrate 102, which can provide electrical connections 106 between the interface 104 and electrical terminals 108, which can be disposed on a lower surface 110 of the wiring substrate 102. The wiring substrate 102 can be, for example, a wiring board such as a printed circuit board, a ceramic substrate comprising internal and/or external electrical connections, or the like. The electrical connections 106 can be, for example, electrically conductive vias and/or traces on and/or in the wiring substrate 102. The lower surface 110 of the wiring substrate 102 can be, for example, substantially parallel with the x, y plane As illustrated in FIGS. 1A and 1B, the probe assembly 120 can comprise electrically conductive probes 140 disposed in guide holes 126 and 130 in upper and lower guide plates 124 and 128, which can be disposed in a frame 122. As shown, the upper guide plate 124 and the lower guide plate 128 can be attached to or disposed in the frame 122 such that the guide plates 124 and 128 are substantially parallel and spaced apart. For example, the guide plates 124 and 128 can be substantially parallel to the surface 110 of the wiring substrate 102, which as discussed above can be substantially parallel with the x, y plane. As also shown, there can be upper guide holes 126 in the upper guide plate 124 and corresponding lower guide holes 130 in the lower guide plate 128, and the probes 140 can be disposed in the guide holes 126 and 130. As can be seen in FIG. 1C, sidewalls 160 of each of the upper holes 126 can be substantially parallel with the z axis.

As shown in FIG. 1B, each probe 140 can comprise a base end 142, a contact end 150, and an elongated flexible body 146 between the base end 142 and the contact end 150. As shown, the base end 142 and the contact end 150 can be at opposite ends of the probe 140. As can be seen in FIG. 1B, an upper portion 144 of the body 146 of each probe 140 can be disposed inside one of the upper guide holes 126 of the upper guide plate 124, and a lower portion 148 of each probe 140 can be disposed in a corresponding one of the lower guide holes 130 in the lower guide plate 128. As shown, the upper portion 144 can be a part of the body 146 that is adjacent the base end 142, and the lower portion 148 can be a part of the body 146 that is adjacent the contact end 150. The width, thickness, diameter, or like dimension of the body 146 of each probe 140 can be smaller than the width, thickness, diameter, or like dimension of the corresponding upper and lower holes 126 and 130 so that the probe 140 can move (e.g., slide) substantially in the z direction in the holes 126 and 130. The probes 140 can thus be said to "float" in the guide plates 124 and 128. As used herein, "float" or "floating" thus means that the probes 140 can move (e.g., slide) substantially in the z direction in the holes 126 and 130 in the guide plates 124 and 128.

As shown in FIG. 1B, the frame 122 can be coupled to the wiring substrate 102 such that the base ends 142 of the probes 140 are in contact with or at least in proximity to the terminals 108 of the wiring substrate 102. As also shown, terminals 182 of an electronic device 180 can be moved M into contact with and pressed against the contact ends 150 of the probes 140. The resulting contact forces substantially in the z direction on the contact ends 150 of the probes 140 can push the base ends 142 of the probes 140 firmly against the terminals 108 of the wiring substrate 102 and then bend or even buckle the elongated bodies 146 of the probes 140. This can create pressure based electrical connections between the probes 140 and the terminals 182 of the electronic device 180 and thus establish electrical connections from the terminals 182 through the probes 140 and electrical connections 106 to the interface 104.

Because the probes 140 float in the guide plates 124 and 128 as discussed above, it is possible that one or more of the probes 140 could move (e.g., shift, slide, or the like) in an undesirable manner in their guide holes 126 and 130 or even fall out of the guide holes 126 and 130 in response to forces other than contact with the electronic device 180. For example, the force of gravity, the force from cleaning media (e.g. gel-based cleaning media), the force from adhesion of the probe tip 150 to the terminals 182, the force of an incidental jarring of the probe card assembly 100, or the like could cause such an unwanted movement in one or more of the probes 140 in the guide holes 126 and 130 or one or more of the probes 140 could even fall out of the guide holes 126 and 130. FIG. 1C illustrates features of each probe 140 that can prevent such unwanted movement of the probes 140.

As shown in FIG. 1C, the base end 142 of each probe 140 can be larger than the corresponding upper guide hole 126, which can prevent the probe 140 from falling out of the guide hole 126. The oversized base end 142 can thus function as a stop.

As also shown in FIG. 1C, the upper portion 144 of the body 146 of each probe 140 can comprise a spring mechanism 162 (which can be an example of a first spring mechanism), which can comprise one or more spring structures that exert normal forces against the sidewalls 160 of the corresponding upper guide hole 126. This can result in a frictional force between the spring mechanism 162 and the sidewalls 160 that is substantially parallel to the sidewalls 160. The spring mechanism 162 can be sized and configured to provide a frictional force against the sidewalls 160 that is sufficiently strong to hold the probe 140 in place in the upper guide hole 126 against the force of gravity on the probe 140, the force of an incidental jarring or bumping of the probe card assembly 100, or a similar unintended force on the probe 140. The frictional force, however, can be significantly less than the force of contact between the contact end 150 of a probe 140 and a terminal 182 of the electronic device 180 as the terminal 182 is pressed against the contact end 150 as discussed above. The size and configuration of the spring mechanism 162 can also be such that the frictional force against the sidewalls 160 is sufficiently weak to allow the probe 140 to move in a z direction in the corresponding upper guide hole 126 in response to the force of contact with the electronic device 180 as discussed above. For example, the contact force can be greater than the frictional force created by the spring mechanism 162, which can be greater than the force of gravity on the probe 140. For example, the contact force of a terminal 182 on the contact end 150 of a probe 140 (e.g., sufficient to bend or even buckle the elongated body 146 of the probe 140) can be two or more times the frictional force, which can be two or more times the force of gravity on the probe 140.

The probe card assembly 100 illustrated in FIGS. 1A-1C is an example only, and variations are contemplated. For example, the probe card assembly 100 can include additional substrates, electrical connectors, and/or wiring boards (not shown) disposed, for example, between the frame 122 and the wiring substrate 102. The terminals 108 can be on any such substrate, electrical connector, or wiring board (not shown) rather than on the lower surface 110 of the wiring substrate 102. As another example, the spring mechanism 162 can alternatively be part of the lower portion 148 of the body 146 of each probe 140 disposed in a lower hole 130 in the lower guide plate 128.

Figure 2B:
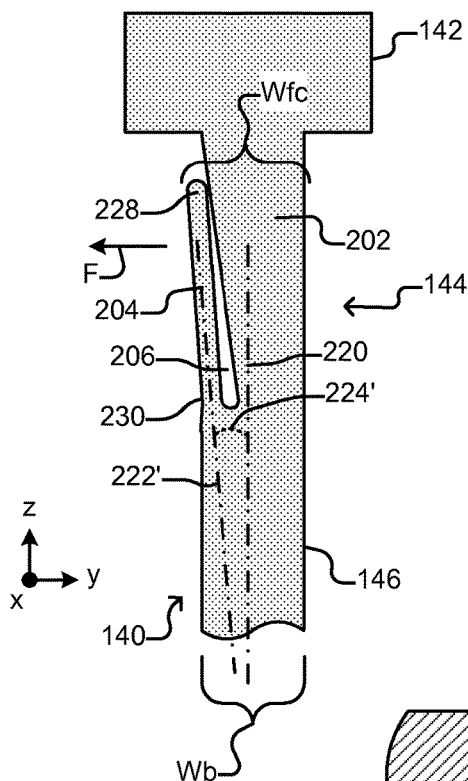
FIG. 2B shows the cantilevered beam of FIG. 2A in a fully compressed state.
Figure 2C:
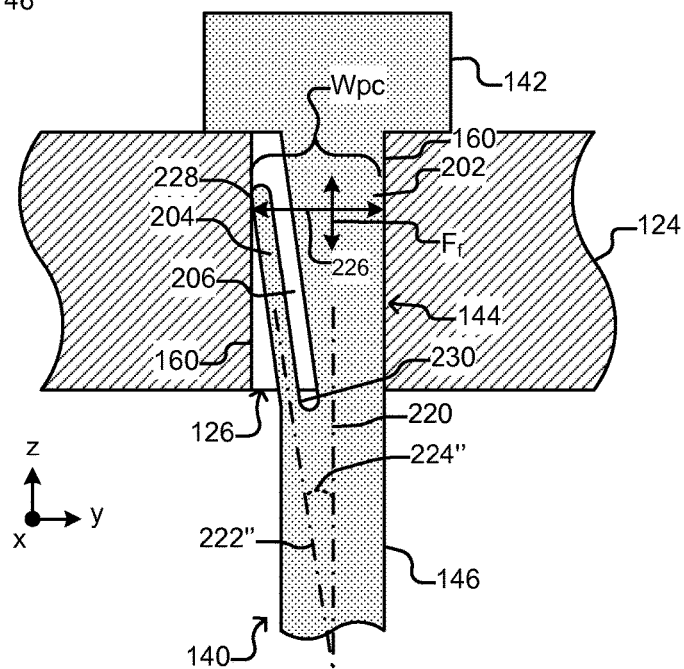
FIG. 2C shows the probe of FIG. 2A inserted into a guide hole of a guide plate.

The spring mechanism 162 illustrated in FIG. 1C can comprise any kind of spring structure or spring structures. For example, in some embodiments, the spring mechanism 162 can comprise one or more compressible flexures. FIGS. 2A-2C illustrate an example of a compressible flexure in the form of a cantilevered beam 204 and a space 206 between the cantilevered beam 204 and a main part 202 of the upper portion 144 of the body 146 of the probe 144.

Figure 3:
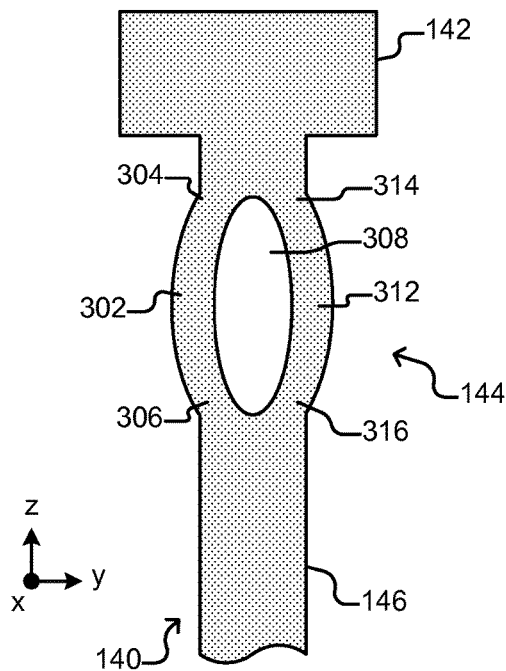
FIG. 3 is a side, cross-sectional partial view of a probe in which the spring mechanism comprises multiple beams each supported at both ends according to some embodiments of the invention.

As illustrated in FIG. 2A (which shows a side, cross-sectional view of part of the probe 140), the upper portion 144 of the body 146 of the probe 140 can comprise a cantilevered beam 204 that is spaced from a main part 202 of the upper portion 144 of the body 146. As shown, the cantilevered beam 204 can be elongated from a base end 230, which can be coupled to (e.g., attached to or integrally formed with) the main part 202 of the upper portion 144 of the body 146, to a free end 228. Alternatively, the "free" end 228 is not free but is attached to the main part 202 of the upper portion of the body 146 as shown in the example of FIG. 3, which is discussed below. Regardless, with reference to FIG. 2A, there can be space 206 between the cantilevered beam 204 and the main part 202, which can allow the cantilevered beam 204 to move toward the main part 202. For example, the cantilevered beam 204 can rotate about the base 230 until the free end 228 contacts the main part 202 as illustrated in FIG. 2B.

The cantilevered beam 204 can comprise material with spring (i.e., resilient) properties and can be formed such that, as the cantilevered beam 204 rotates such that the free end 228 moves toward the main part 202, the cantilevered beam 204 is in an at least partially compressed state and provides a spring force F that tends to restore the cantilevered beam 204 to the uncompressed state in which the cantilevered beam 204 is separated from the main part 202 by the original size of the space 206 as shown in FIG. 2A. The cantilevered beam 204 is thus an example of a spring element.

As shown in FIG. 2A, in an uncompressed state, the elongated length of the cantilevered beam 204 can be disposed along an axis 222 (hereinafter referred to as the beam axis 222), which can be oriented at an angle 224 with respect to an axis 220 that is substantially parallel to the z axis. As noted above, the z axis can be substantially parallel to the sidewalls 160 of an upper hole 126 in the upper guide plate 126. The angle 224 can be, for example, substantially zero or can be greater than zero degrees. For example, the angle 224 can be at least two, three, four, five, ten, fifteen, twenty, or twenty five degrees. As shown in FIG. 2B, in a fully compressed state (i.e., the free end 228 is moved against the main part 202 as shown in FIG. 2B), the angle 224' between the axis 220 and the beam axis 222' can be less than the angle 224 in the uncompressed state shown in FIG. 2A. FIG. 2C illustrates the cantilevered beam 204 in a partially compressed state in which the angle 224" between the axis 220 and the beam axis 222" is less than the angle 224 in the uncompressed state shown in FIG. 2A but greater than the angle 224' in the fully compressed state shown in FIG. 2B. It is noted that, in the partially compressed state of the cantilevered beam 204 shown in FIG. 2C, the space 206 between the free end 228 of the cantilevered beam 204 and the main part 202 can be less than the space 206 between the free end 228 of the cantilevered beam 204 and the main part 202 in the uncompressed state shown in FIG. 2A.

As shown in FIG. 2A, while the cantilevered beam 204 is in the uncompressed state, the lateral (normal to the z axis) width Wu of the free end 228 of the cantilevered beam 204, the space 206, and the main part 202 normal to the axis 220 can be greater than the lateral width Wh of the guide hole 126. As noted, the axis 220 can be substantially parallel to the sidewalls 160 (which can be oriented substantially parallel to the z axis) of the guide hole 126. As illustrated in FIG. 2B, while the cantilevered beam 204 is in a fully compressed state, the lateral width Wfc of the free end 228 of the cantilevered beam 204, the space 206, and the main part 202 normal to the axis 220 can be less than the width Wh of the guide hole 126. As illustrated in FIG. 2C, while the cantilevered beam 204 is in a partially compressed state, the lateral width Wpc of the free end 228 of the cantilevered beam 204, the space 206, and the main part 202 normal to the axis 220 can be equal to the width Wh of the guide hole 126. As shown in FIGS. 2A and 2B, the lateral uncompressed width Wu and the lateral fully compressed width Wfc can be greater than the lateral width Wb of the body 146 of the probe 140, and the lateral width Wb can be less than the lateral width Wh of the hole.

As illustrated in the transition from FIG. 2A to FIG. 2C, starting from the contact end 150 (see FIG. 1B), the probe 140 can be inserted into the guide hole 126. As shown in FIG. 2C, because the uncompressed lateral width Wu illustrated in FIG. 2A is greater than the lateral width Wh of the guide hole 126, the cantilevered beam 204 can compress at least partially inside the guide hole 126 and thus exert normal forces 226 against the sidewalls 160 of the guide hole 126. The normal forces 226 of the cantilevered beam 204 against the sidewalls 160 can create a frictional force Ff between the cantilevered beam 204 and the sidewalls 160. This frictional force Ff can act in directions that are substantially parallel to the z axis and thus prevent unwanted motion or float of the probe 140 in the z direction. The cantilevered beam 204 and space 206 can be sized and configured such that the foregoing frictional force Ff is substantially less than the force of contact of a terminal 182 of the electronic device 180 as the terminal 182 is pressed against the contact end 150 of the probe 140 as discussed above, and such that the frictional force Ff is substantially greater than the force of gravity Fg on the probe 140. Thus, the cantilevered beam 204 and space 206 can be sized and configured such that the contact force of the terminal 182 being pressed against the contact end 150 of a probe 140 (e.g., sufficient to bend or even buckle the body 146 of the probe 140) is greater than (e.g., 1.5, 2, 3, 4, 5, or more times) the frictional force Ff, and the frictional force Ff is greater than (e.g., 1.5, 2, 3, 4, 5, or more times) the force of gravity Fg on the probe 140.

Configured with the cantilevered beam 204 of FIGS. 2A-2C as the spring mechanism 162 in FIGS. 1A-1C, the cantilevered beam 204 of each of the probes 140 in the probe card assembly 100 of FIGS. 1A-1C can thus inhibit unwanted movement of the probes 140 within the guide plates 124 and 128 while allowing, in some embodiments, movement in response to larger forces from contact with an electronic device and allowing for sufficiently high contact forces between the terminals 182 of the electronic device 180 and the contact ends 150 of the probes 140 to establish low resistance electrical connections between the probes 140 and the terminals 182

Figure 4:
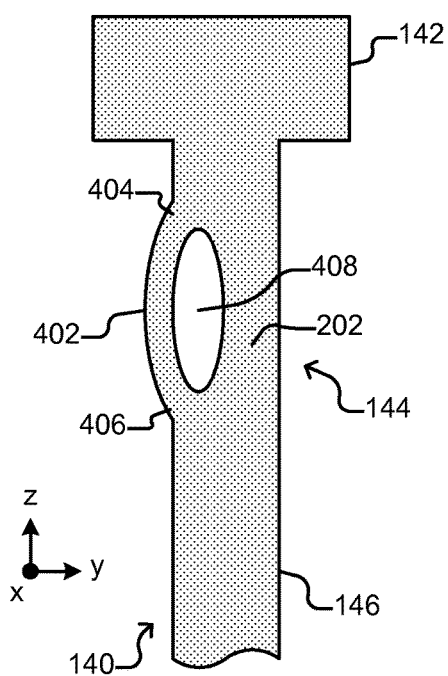
FIG. 4 is a side, cross-sectional partial view of a probe in which the spring mechanism comprises a beam supported at both ends according to some embodiments of the invention.

The cantilevered beam 204 separated by a space 206 from a main part 202 of the upper portion 144 of the probe body 146 is but an example of the spring mechanism 162. FIGS. 3 and 4 illustrate additional examples.

As shown in FIG. 3 (which shows a side, cross-sectional view of part of the probe 140), the upper portion 144 of the body 146 of the probe 140 can comprise multiple elongated beams 302 and 312 separated from each other by a space 308, which can allow the beams 302 and 312 to move toward each other. As shown, each beam 302 and 312 can be coupled at its ends to the body 146 of the probe 140. For example, the beam 302 can be coupled at a first end 304 and a second opposite end 306 to the body 146, and the beam 312 can be coupled at a first end 314 and a second opposite end 316 to the body 146.

Like the cantilevered beam 204, the beams 302 and 312 can comprise material with spring (i.e., resilient) properties and can be formed such that, as the beams 302 and 312 are pressed through the space 308 toward each other, the beams 302 and 312 are in an at least partially compressed state and provide a spring force that tends to restore the beams 302 and 312 to the uncompressed state in which the beams 302 and 312 are separated from each other by the original size of the space 308. The beams 302 and 312 are thus examples of spring elements, and the beams 302 and 312 and space 308 are an example of a compressible flexure that can be an example of the spring mechanism 162 of FIGS. 1A-1C.

As illustrated in FIG. 4 (which shows a side, cross-sectional view of part of the probe 140), the upper portion 144 of the body 146 of the probe 140 can comprise a beam 402 that, like the cantilevered beam 204 discussed above, is spaced from a main part 202 of the upper portion 144 of the body 146. Also like the cantilevered beam 204 of FIGS. 2A-2C, the beam 402 can be elongated from a first end 406 to a second opposite end 404. Unlike the cantilevered beam 204, however, the beam 402 is coupled at both ends 404 and 406 to the main part 202 of the upper portion 144 of the body 146. As shown, there can be space 408 between the beam 402 and the main part 202, which can allow the beam 402 to move toward the main part 202.

Like the cantilevered beam 204, the beam 402 can comprise material with spring (i.e., resilient) properties and can be formed such that, as the beam 402 is pressed through the space 408 toward the main part 202, the beam 402 is in an at least partially compressed state and provides a spring force that tends to restore the beam 402 to the uncompressed state in which the beam 402 is separated from the main part 202 by the original size of the space 408. The beam 402 is thus an example of a spring element, and the beam 402 and space 408 are an example of a compressible flexure that can be an example of the spring mechanism 162 of FIGS. 1A-1C.

As discussed above, the base end 142 (see FIG. 1C) of a probe 140 can be larger than a corresponding upper guide hole 126, which can prevent the probe 140 from falling out of the guide plates 124 and 128. This can, however, also prevent a probe 140 from being intentionally removed from the guide plates 124 and 128 unless the probe card assembly 100 is first dissembled.

Figure 5A:
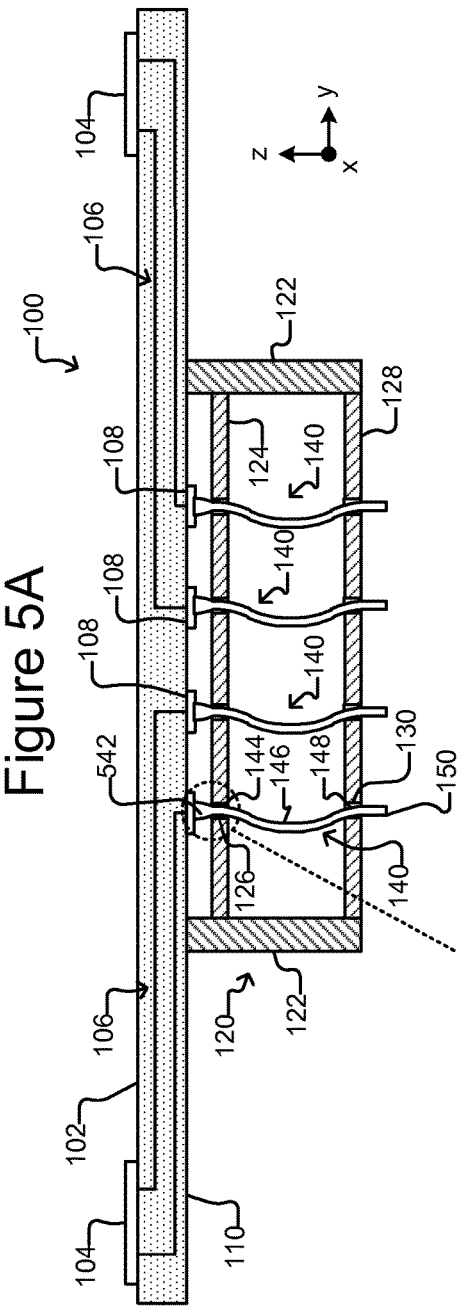
FIG. 5A is a side, cross-sectional view of the probe card assembly of FIGS. 1A-1C but with a probe having a compressible stop structure according to some embodiments of the invention.
Figure 5C:
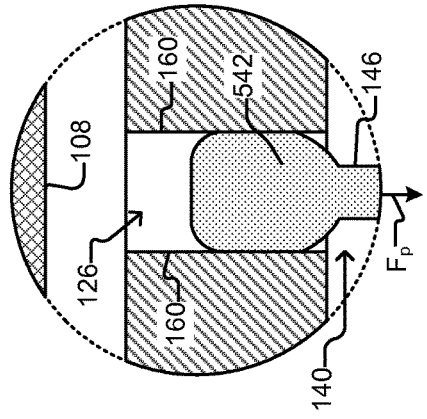
FIG. 5C is a detailed view of the compressible stop of FIG. 5B in a compressed state according to some embodiments of the invention.
Figure 5B:
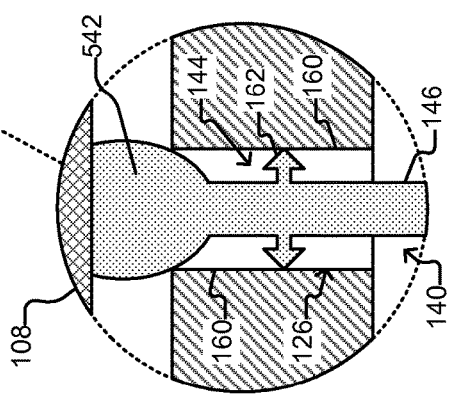
FIG. 5B is a detailed view of the compressible stop of FIG. 5A according to some embodiments of the invention.

FIGS. 5A-5C illustrate the probe card assembly 100 in which the base end 542 of the probe 140 comprises a compressible stop structure. It is noted that any of the probes 140 illustrated in the Figures can be configured with the base end 542 shown in FIGS. 5A-5C rather than the base end 142.

As shown in FIG. 5B, in an uncompressed state, the base end 542 is larger than the upper guide hole 126. As shown in FIG. 5C, application of a sufficiently large downward (parallel to the sidewalls 160 of the upper guide hole 126) pulling force $F_p$ to the probe body 146 can pull the base end 542 into the guide hole 126, compressing the base end 542 to the size of the guide hole 126. The pulling force $F_p$ can alternatively be another type force such as a pushing force. This can allow a probe 140 to be pulled out of the guide hole 126 and a corresponding guide hole 130 in the lower guide plate 128 upon application of a sufficiently large pulling force $F_p$. Absent the pulling force $F_p$, however, the base end 542 functions as a stop the same as the base end 142 as discussed above. For example, the base end 542 can prevent the probe 140 from falling out of the guide plates 124 and 128.

The base end 542 can be structured so that the force $F_p$ required to pull the base end 542 into and then out of the upper guide hole 126 is greater than the force of gravity $F_g$ on the probe 140 and even greater than the contact force (e.g., a force of contact that bends or even buckles the elongated body 146 of a probe 140) on the probe 140 as a terminal 182 of the electronic device 180 is pressed against the contact end 150 of the probe 140 as discussed above. For example, the force pulling $F_p$ can be 3, 4, 5, or more times the force of gravity $F_g$ on the probe 140, and the pulling force $F_p$ can be 1.5, 2, 3, or more times the aforementioned contact force.

A probe 140 with the compressible base end 542 shown in FIGS. 5A-5C can be pulled out of the guide plates 124 and 128 and thus removed from the probe card assembly 100 while the probe card assembly 100 is fully assembled. It is also noted that a probe 140 not initially part of the probe card assembly 100 can be added to the probe card assembly 100 while the probe card assembly 100 is fully assembled by pushing the base end 542 through the lower and upper guide holes 130 and 126 with the opposite of the pulling force $F_p$, which is thus the reverse of the pulling action for removing a probe 140 discussed above. The foregoing can allow, for example, a damaged probe 140 to be removed from the probe card assembly 100 and replaced with a new probe 140 without dissembling the probe card assembly 100 or even the probe assembly 120 (see FIGS. 1A-1C).

Figure 6B:
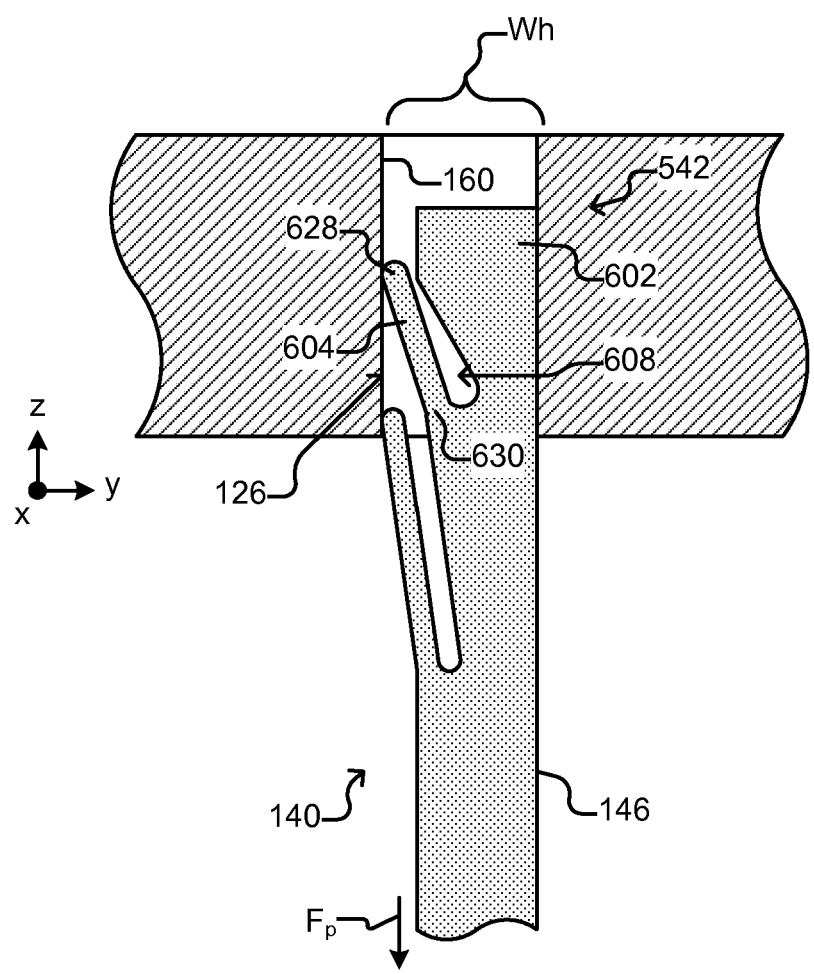
FIG. 6B is a side, cross-sectional partial view of the probe of FIG. 6A in which the compressible stop structure comprising a cantilevered beam is compressed according to some embodiments of the invention.
Figure 7B:
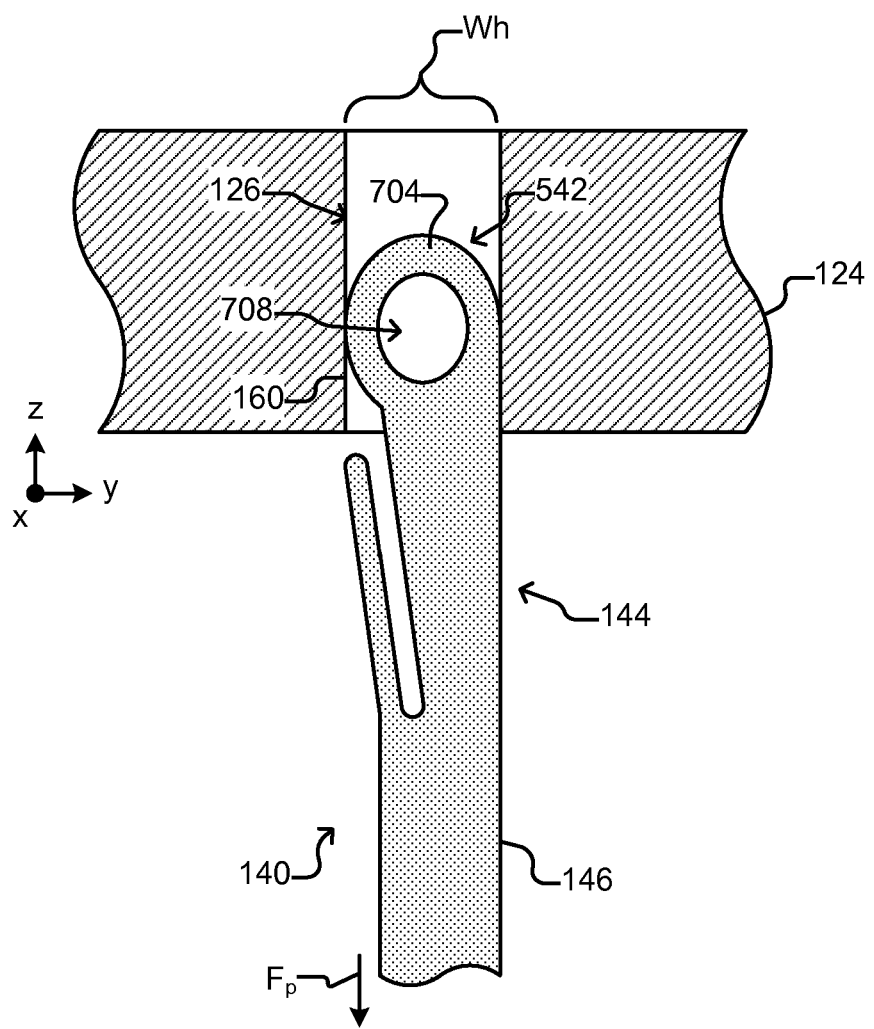
FIG. 7B is a side, cross-sectional partial view of the probe of FIG. 6A in which the compressible stop structure comprising a hollow bulb structure is compressed according to some embodiments of the invention.

The compressible base end 542 can illustrated in FIGS. 5A-5C can comprise any kind of spring structure or spring structures. For example, in some embodiments, the base end 542 can comprise one or more compressible flexures. FIGS. 6A and 6B illustrate one example, and FIGS. 7A and 7B illustrate another example.

As shown in FIG. 6A, the base end 542 can comprise a compressible flexure in the form of a cantilevered beam 604 and a space 608 between the cantilevered beam 604 and a main part 602 of the base end 542. In such a configuration, the base end 542 is in some ways similar to the configuration of the spring mechanism 162 illustrated in FIGS. 2A-2C.

As shown FIG. 6A, the cantilevered beam 604 can be elongated from a first end 630, which can be coupled to (e.g., attached to or integrally formed with) the main part 602, to a free end 628. Moreover, there can be space 608 between the cantilevered beam 604 and the main part 602, which can allow the cantilevered beam 604 to move toward the main part 602. For example, the cantilevered beam 604 can rotate about the first end 630 until the free end 628 contacts the main part 602.

The cantilevered beam 604 can comprise material with spring (i.e., resilient) properties and can be formed such that, as the cantilevered beam 604 rotates such that the free end 628 moves toward the main part 602, the cantilevered beam 604 is in an at least partially compressed state and provides a spring force that tends to restore the cantilevered beam 604 to the uncompressed state in which the cantilevered beam 604 is separated from the main part 602 by the original size of the space 608.

As shown in FIG. 6A, in an uncompressed state, the lateral width Wb of the cantilevered beam 604, the space 608, and the main part 602 is wider than the width Wh (see FIG. 6B) of the guide hole 126. Uncompressed, the cantilevered beam 604 thus functions as a stop that prevents the base end 542 from moving into the guide hole 126. As shown in FIG. 6B, application of the pulling force $F_p$ to the probe body 146 compresses the cantilevered beam 604 at least partially, allowing the base end 542 to be pulled into the guide hole 126 as shown and ultimately out of the guide hole 126 as discussed above.

FIGS. 7A and 7B illustrate an alternative configuration in which the base end 542 comprises a bulb structure 704 with a hollow interior 708. As illustrated in FIG. 7A, while the bulb structure 704 is in an uncompressed state, the lateral width Wb of the bulb structure 704 is wider than the width Wh (see FIG. 7B) of the guide hole 126. Uncompressed, the bulb structure 704 thus functions as a stop that prevents the base end 542 from moving into the guide hole 126. As shown in FIG. 7B, application of the pulling force Fp to the probe body 146 compresses the bulb structure 704 into the hollow interior space 708, allowing the base end 542 to be pulled into the guide hole 126 as shown and ultimately out of the guide hole 126 as discussed above.

Although the probe 140 is illustrated in FIGS. 6A-7B with the cantilevered beam 204 of FIGS. 2A-2C, the probe 140 can alternatively have other configurations of the spring mechanism 162 such as the beams 302 and 312 shown in FIG. 3 and the beam 402 shown in FIG. 4.

Embodiments of the invention illustrated and discussed herein can provide advantages. One such advantage is illustrated in FIG. 8.

Figure 8:
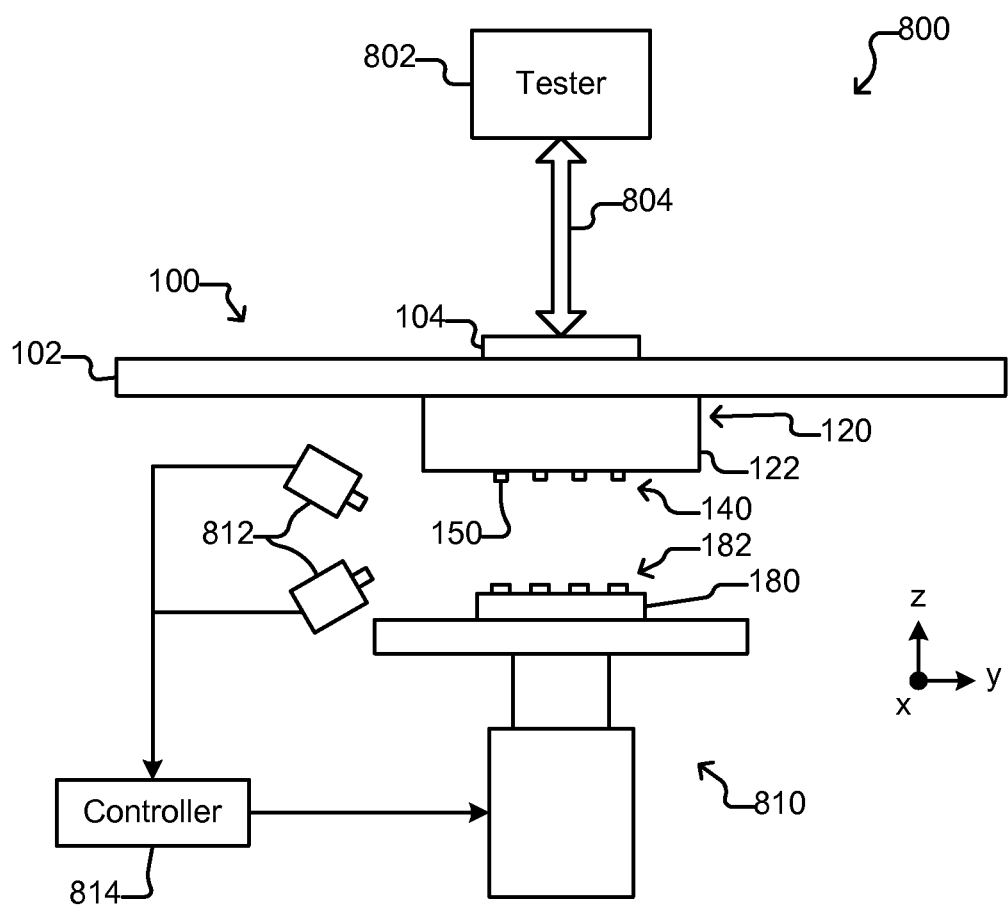
FIG. 8 shows an example of a test system in which the probe card assembly of FIGS. 1A-1C can be used according to some embodiments of the invention.

FIG. 8 illustrates a test system 800 in which the probe card assembly 100 can be used to test an electronic device 180 comprising input and/or output terminals 182. As shown, the interface 104 can be connected through communications channels 804 to a tester 802, which can comprise test equipment (e.g., a programmed computer) for providing power, control signals, and/or test signals through the communications channels 804 and probe card assembly 100 to terminals 182 of the electronic device 180. The tester 802 can also monitor through the probe card assembly 100 and communications channels 804 response signals generated by the electronic device 180. The tester 802 can thus control testing of the electronic device 100.

Prior to testing, the electronic device 180 can be disposed on a moveable support 810. Cameras 812 can capture images of the contact ends 150 of the probes 140 and the terminals 182 of the electronic device 180, and a controller 814 can move in the x, y plane the support 810 so that the terminals 182 align with correspond contact ends 150 of the probes 140. Once the terminals 182 are aligned with corresponding contact ends 150, the controller 814 can cause the support 810 to move the electronic device 180 in the z direction so that the terminals 182 contact and are pressed against the corresponding contact ends 150 of the probes 140, establishing pressured based electrical connections between the terminals 182 and the probes 140 and thus complete electrical paths between the tester 802 and the terminals 182 of the electronic device 180.

If any of the probes 140 fall out of the probe card assembly 100 (e.g., by falling out of the guide plates 124 and 128 due to the force of gravity or a jarring or bumping of the probe card assembly 100 as discussed above), there will not be an electrical connection from the tester 802 to corresponding terminals 182 of the electronic device 180. Moreover, even if any of the probes 140 merely move inadvertently in the z direction, the contact ends 150 of those probes 140 can be difficult to detect in the images from the cameras 812, and it can be difficult to align the terminals 182 with the contact ends 182. Because the spring mechanisms 162, whether configured as the cantilevered beam 204 of FIGS. 2A-2C or otherwise, can impede inadvertent movement of the probes 140 in the holes 126 of the guide plate 124, the spring mechanism 162 can overcome the foregoing problems and/or other problems.

Figure 9:
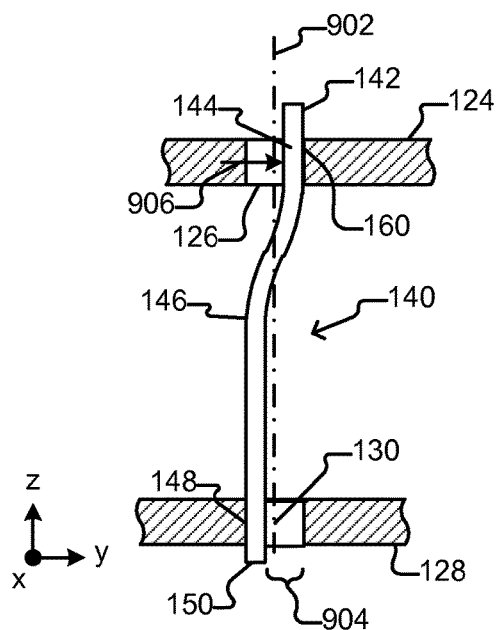
FIG. 9 shows an example of a probe in which a lower portion of the probe body that is inside a guide hole in a lower guide plate is offset from an upper portion of the probe body that is inside a guide hole in an upper guide plate according to some embodiments of the invention.
Figure 10:
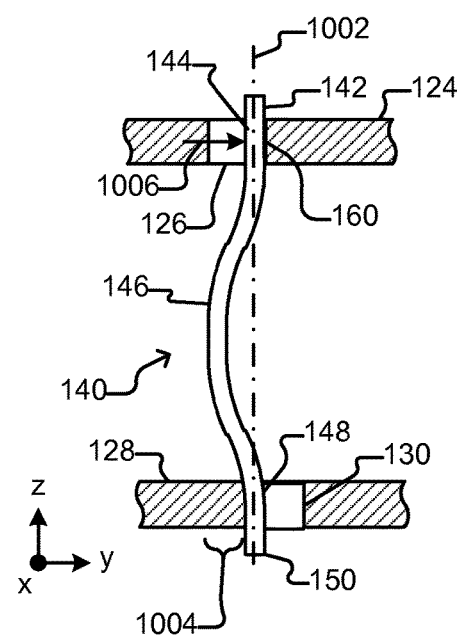
FIG. 10 shows an example in which a guide hole in a lower guide plate is offset from a guide hole in an upper guide plate according to some embodiments of the invention.

FIGS. 9 and 10 illustrate examples of alternative ways of inducing normal forces of a probe against sidewalls of a guide hole. As will be seen, the examples shown in FIGS. 9 and 10 utilize the body 146 of the probe 140 as a spring mechanism that induces the normal forces.

In the example shown in FIG. 9, the upper guide hole 126 in the upper guide plate 124 is substantially aligned with the lower guide hole 130 in the lower guide plate 128 along an axis 902 that is substantially parallel with the sidewalls 160 of the guide hole 126. The lower portion 148 of the probe body 146, however, can be offset from the upper portion 144 of the body 146. (As discussed above, the lower portion 148 is disposed inside a guide hole 130 in the lower guide plate 128, and the upper portion 144 is disposed inside a guide hole 126 in the upper guide plate 124.) For example, as shown in FIG. 9, the lower portion 148 can be spaced an offset distance 904 from the upper portion 144. The offset distance 904 can be substantially perpendicular to the sidewalls 160 of the guide hole 126.

Due to the offset distance 904, the guide plates 124 and 128 can preload the probe 140 such that the body 146 of the probe 140 functions as a spring and causes the upper portion 144 of the probe body 146 to exert normal forces 906 against the sidewalls 160 of the guide hole 126 as shown in FIG. 9. As discussed above, the sidewalls 160 of the guide hole 126 are oriented in the z direction, and the normal forces 906, which are normal to the sidewalls 160, are thus substantially perpendicular to the sidewalls 160.

The normal forces 906 can have any of the characteristics of the normal forces 226 discussed above. For example, the probe 140 and offset distance 904 can be configured and sized such that the normal forces 906 create frictional forces that are parallel to the sidewalls 160 and impede unwanted movement in the z direction of the probe 140. In some embodiments, the normal forces 906, and thus the resulting frictional forces, can be 2, 3, 4, 5, or more times the force of gravity $F_g$ on the probe 140.

As shown in FIG. 10, a similar result can be obtained by offsetting the guide hole 126 in the upper guide plate 124 from the guide hole 130 in the lower guide plate 128. That is, in the example illustrated in FIG. 10, the lower portion 148 of the probe body 146 can be aligned with the upper portion 144 along an axis 1002 that is substantially parallel to the sidewalls 160, but the guide hole 130 in the lower guide plate 128 can be offset from the guide hole 126 in the upper guide plate 124. For example, as shown in FIG. 10, the guide hole 130 can be spaced an offset distance 1004 from the guide hole 126. The offset distance 1004 can be substantially perpendicular to the sidewalls 160 of the guide hole 126. This can be accomplished, for example, by aligning the guide holes 126 and 130 during assembly and then, after the probe 140 is inserted into the guide holes 126 and 130, shifting the guide plates 124 and 128 relative to each other by the offset distance 1004.

Due to the offset distance 1004, the guide plates 124 and 128 can preload the probe 140 such that the body 146 of the probe 140 functions as a spring and causes the upper portion 144 of the probe body 146 to exert normal forces 1006 against the sidewalls 160 of the guide hole 126 as shown in FIG. 10. As discussed above, the sidewalls 160 of the guide hole 126 are oriented in the z direction, and the normal forces 1006, which are normal to the sidewalls 160, are thus substantially perpendicular to the sidewalls 160.

The normal forces 1006 can have any of the characteristics of the normal forces 226 discussed above. For example, the probe 140 and offset distance 1004 can be configured and sized such that the normal forces 1006 create frictional forces that are parallel to the sidewalls 160 and impede unwanted movement in the z direction of the probe 140. In some embodiments, the normal forces 1006, and thus the resulting frictional forces, can be 2, 3, 4, 5, or more times the force of gravity $F_g$ on the probe 140.

Although specific embodiments and applications of the invention have been described in this specification, these embodiments and applications are exemplary only, and many variations are possible.

We claim:

1. A probe card assembly, comprising:
    electrically conductive substrate terminals disposed on a substrate; and
    a probe assembly coupled to said substrate, said probe assembly comprising:
        a guide plate comprising guide holes; and
        electrically conductive probes configured to contact device terminals of an electronic device to test the electronic device, each said probe comprising a base end electrically connectable to one of said substrate terminals and disposed outside of one of said guide holes and to a first side of said guide plate, a contact end disposed outside of said one of said guide holes and to a second side of said guide plate that is opposite said first side, and an elongated flexible body between said base end and said contact end, wherein a portion of said body of said probe is disposed inside said one of said guide holes and comprises a spring mechanism configured to exert a normal force against sidewalls of said one of said guide holes but nevertheless allow said probe to float in said first of said guide holes,
    wherein said probe is configured to bend or buckle responsive to a contact force on said contact end of said probe in response to direct contact between the contact end and one of the device terminals of the electronic device;
        wherein said normal force against said sidewalls of said one of said guide holes results in a frictional force that is substantially parallel to said sidewalls;
        wherein operation of said probe card assembly for testing an electronic device provides said contact force;
        wherein said contact force is two or more times greater then said frictional force; and
        wherein said frictional force is two or more times greater than a force of gravity on said probe.

2. The probe card assembly of claim 1, wherein said spring mechanism comprises a compressible flexure structure.

3. The probe card assembly of claim 2 further comprising an interface to a tester for testing an electronic device, wherein said probes are electrically connected to said substrate terminals, which are electrically connected to said interface.

4. The probe card assembly of claim 2, wherein in an uncompressed state, a lateral width of said compressible flexure structure is greater than a lateral width of said one of said guide holes.

5. The probe card assembly of claim 4, wherein disposed in said one of said guide holes, said compressible flexure structure is at least partially compressed.

6. The probe card assembly of claim 2, wherein said compressible flexure structure comprises a moveable spring element.

7. The probe card assembly of claim 6, wherein said moveable spring element comprises a cantilevered beam that extends from a main part of said portion of said body disposed inside said one of said guide holes.

8. The probe card assembly of claim 6, wherein said moveable spring element comprises a beam comprising:
    a first end coupled to a main part of said portion of said body disposed inside said one of said guide holes,
    a second end opposite said first end and coupled to said main part of said portion of said body, and
    an elongated body between said first end and said second end,
    wherein there is a space between said elongated body of said beam and said main part of said portion of said body.

9. The probe card assembly of claim 7, wherein:
    said cantilevered beam comprises a base coupled to said main part of said portion of said body and a free end opposite said base,
    said cantilevered beam is elongated from said base to said free end, and
    said free end of said cantilevered beam is moveable through a space between said free end and said main part of said portion of said body.

10. The probe card assembly of claim 9, while said cantilevered beam is in an uncompressed state, a lateral width of said free end, said space, and said main part of said portion of said body is wider than a lateral width of said one of said guide holes.

11. The probe card assembly of claim 9, wherein an angle between a beam axis through said base and said free end of said cantilevered beam and an axis parallel to said sidewalls of said one of said guide holes is at least one degree.

12. The probe card assembly of claim 10, wherein disposed in said one of said guide holes, said cantilevered beam is in an at least partially compressed state in which said space between said free end and said main part of said portion is smaller than said space when said cantilevered beam is in said uncompressed state.

13. The probe card assembly of claim 2, wherein said portion of said body of said probe disposed inside one of said guide holes including said spring mechanism is a single, unitary structure.

14. The probe card assembly of claim 2, wherein said elongated, flexible body of said probe from said base end to said contact end including said spring mechanism is a single, unitary structure.

15. The probe card assembly of claim 14, wherein said elongated flexible body extends from said base end to said contact end.

16. The probe card assembly of claim 1, wherein said base end of said probe is wider than said one of said guide holes and prevents said base from moving into said guide hole.

17. The probe card assembly of claim 1, wherein:
said guide plate is an upper guide plate,
said one of said guide holes is an upper guide hole in said upper guide plate,
said portion of said probe disposed inside said one of said guide holes is an upper portion of said body of said probe adjacent said base end,
said probe card assembly further comprises a lower guide plate comprising lower guide holes,
said probe further comprises a lower portion of said body disposed inside one of said lower guide holes,
said one of said guide holes is substantially aligned with said one of said lower guide holes along an axis that is substantially parallel to said sidewalls, and
said upper portion of said probe is sufficiently offset from said lower portion of said probe in a direction that is substantially perpendicular to said sidewalls that said upper portion of said probes presses against said sidewalls with said normal force.

18. The probe card assembly of claim 1, wherein:
said guide plate is an upper guide plate,
said one of said guide holes is an upper guide hole in said upper guide plate,
said portion of said probe disposed inside said one of said guide holes is an upper portion of said body of said probe adjacent said base end,
said probe card assembly further comprises a lower guide plate comprising lower guide holes,
said probe further comprises a lower portion of said body disposed inside one of said lower guide holes,
said upper portion of said probe is substantially aligned with said lower portion of said probe along an axis that is substantially parallel to said sidewalls, and
said one of said guide holes is sufficiently offset from said one of said lower guide holes in a direction that is substantially perpendicular to said sidewalls that said upper portion of said probe presses against said sidewalls with said normal force.

19. The probe card assembly of claim 1, wherein said probe slides in said guide hole in response to a contact force from one of the device terminals of the electronic device on said contact end that is greater than said normal force.

20. The probe card assembly of claim 1, wherein said spring mechanism directly contacts said sidewalls of said one of said guide holes.

21. The probe card assembly of claim 20, wherein said spring mechanism exerts said normal force directly against said sidewalls of said one of said guide holes.

* * * * *